(12) United States Patent
McKinzie, III

(10) Patent No.: US 8,299,867 B2
(45) Date of Patent: *Oct. 30, 2012

(54) ADAPTIVE IMPEDANCE MATCHING MODULE

(75) Inventor: William E. McKinzie, III, Fulton, MD (US)

(73) Assignee: Research In Motion RF, Inc., Wilmington, DE (US)

( * ) Notice: Subject to any disclaimer, the term of this patent is extended or adjusted under 35 U.S.C. 154(b) by 1178 days.

This patent is subject to a terminal disclaimer.

(21) Appl. No.: 11/594,310

(22) Filed: Nov. 8, 2006

(65) Prior Publication Data

US 2008/0122553 A1   May 29, 2008

(51) Int. Cl.
*H03H 7/38*   (2006.01)
(52) U.S. Cl. .......................... 333/17.3; 333/32; 455/125
(58) Field of Classification Search ................. 324/600, 324/158.1, 520, 525; 333/124, 17.3; 455/125
See application file for complete search history.

(56) References Cited

U.S. PATENT DOCUMENTS

| | | |
|---|---|---|
| 3,117,279 A | 1/1964 | Ludvigson |
| 3,160,832 A | 12/1964 | Beitman |
| 2,745,067 A | 5/1965 | True |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,777,490 A | 10/1988 | Sharma |

(Continued)

FOREIGN PATENT DOCUMENTS

DE      19614655      10/1997

(Continued)

OTHER PUBLICATIONS

Ida, I. et al., "An Adaptive Impedence Matching System and Its Application to Mobile Antennas", TENCON 2004, IEEE Region 10 Conference, See Abstract ad p. 544, Nov. 21-24, 2004, 543-547.

(Continued)

*Primary Examiner* — Temesgh Ghebretinsae
*Assistant Examiner* — Richard Chan
(74) *Attorney, Agent, or Firm* — Guntin Meles & Gust, PLC; Andrew Gust

(57) ABSTRACT

An embodiment of the present invention provides an apparatus, comprising an RF input port, an RF output port connected to the RF input port via a multichip adaptive impedance matching module (AIMM), and the multichip AIMM comprising one or more voltage or current controlled variable reactive elements, wherein the multichip AIMM is adapted to maximize RF power transferred from the at least one RF input port to the at least one RF output port by varying the bias voltage or bias current to the voltage or current controlled variable reactive elements to maximize the RF voltage at the at least one RF output port.

20 Claims, 6 Drawing Sheets

U.S. PATENT DOCUMENTS

| | | | |
|---|---|---|---|
| 4,799,066 A | 1/1989 | Deacon | |
| 4,965,607 A | 10/1990 | Wilkins | |
| 5,032,805 A | 7/1991 | Elmer | |
| 5,142,255 A | 8/1992 | Chang | |
| 5,177,670 A | 1/1993 | Shinohara | |
| 5,195,045 A * | 3/1993 | Keane et al. | 702/107 |
| 5,200,826 A | 4/1993 | Seong | |
| 5,212,463 A | 5/1993 | Babbitt | |
| 5,243,358 A | 9/1993 | Sanford | |
| 5,258,728 A | 11/1993 | Taniyoshi | |
| 5,276,912 A | 1/1994 | Siwiak | |
| 5,301,358 A | 4/1994 | Gaskill | |
| 5,307,033 A | 4/1994 | Koscica | |
| 5,310,358 A | 5/1994 | Johnson | |
| 5,312,790 A | 5/1994 | Sengupta | |
| 5,334,958 A | 8/1994 | Babbitt | |
| 5,371,473 A | 12/1994 | Trinh | |
| 5,409,889 A | 4/1995 | Das | |
| 5,427,988 A | 6/1995 | Sengupta | |
| 5,430,417 A | 7/1995 | Martin | |
| 5,446,447 A | 8/1995 | Carney | |
| 5,448,252 A | 9/1995 | Ali | |
| 5,451,567 A | 9/1995 | Das | |
| 5,451,914 A | 9/1995 | Stengel | |
| 5,457,394 A | 10/1995 | McEwan | |
| 5,472,935 A | 12/1995 | Yandrofski | |
| 5,479,139 A | 12/1995 | Koscica | |
| 5,486,491 A | 1/1996 | Sengupta | |
| 5,496,795 A | 3/1996 | Das | |
| 5,502,372 A | 3/1996 | Quan | |
| 5,524,281 A | 6/1996 | Bradley | |
| 5,561,407 A | 10/1996 | Koscica | |
| 5,564,086 A | 10/1996 | Cygan | |
| 5,593,495 A | 1/1997 | Masuda | |
| 5,635,433 A | 6/1997 | Sengupta | |
| 5,635,434 A | 6/1997 | Sengupta | |
| 5,640,042 A | 6/1997 | Koscica | |
| 5,679,624 A | 10/1997 | Das | |
| 5,689,219 A | 11/1997 | Piirainen | |
| 5,693,429 A | 12/1997 | Sengupta | |
| 5,694,134 A | 12/1997 | Barnes | |
| 5,699,071 A | 12/1997 | Urakami | |
| 5,766,697 A | 6/1998 | Sengupta | |
| 5,778,308 A | 7/1998 | Sroka | |
| 5,786,727 A | 7/1998 | Sigmon | |
| 5,812,943 A | 9/1998 | Suzuki | |
| 5,830,591 A | 11/1998 | Sengupta | |
| 5,846,893 A | 12/1998 | Sengupta | |
| 5,874,926 A | 2/1999 | Tsuru | |
| 5,880,635 A | 3/1999 | Satoh | |
| 5,886,867 A | 3/1999 | Chivukula | |
| 5,929,717 A | 7/1999 | Richardson | |
| 5,963,871 A * | 10/1999 | Zhinong et al. | 455/552.1 |
| 5,969,582 A | 10/1999 | Boesch | |
| 5,990,766 A | 11/1999 | Zhang | |
| 6,009,124 A | 12/1999 | Smith | |
| 6,020,787 A | 2/2000 | Kim | |
| 6,029,075 A | 2/2000 | Das | |
| 6,045,932 A | 4/2000 | Jia | |
| 6,061,025 A | 5/2000 | Jackson | |
| 6,074,971 A | 6/2000 | Chiu | |
| 6,096,127 A | 8/2000 | Dimos | |
| 6,100,733 A | 8/2000 | Dortu | |
| 6,101,102 A | 8/2000 | Brand | |
| 6,133,883 A | 10/2000 | Munson | |
| 6,172,385 B1 | 1/2001 | Duncombe | |
| 6,215,644 B1 | 4/2001 | Dhuler | |
| 6,281,847 B1 | 8/2001 | Lee | |
| 6,343,208 B1 | 1/2002 | Ying | |
| 6,377,142 B1 | 4/2002 | Chiu | |
| 6,377,217 B1 | 4/2002 | Zhu et al. | |
| 6,377,440 B1 | 4/2002 | Zhu et al. | |
| 6,384,785 B1 | 5/2002 | Kamogawa | |
| 6,404,614 B1 | 6/2002 | Zhu | |
| 6,408,190 B1 | 6/2002 | Ying | |
| 6,414,562 B1 | 7/2002 | Bouisse | |
| 6,415,562 B1 | 7/2002 | Donaghue | |
| 6,452,776 B1 | 9/2002 | Chakravorty | |
| 6,461,930 B2 | 10/2002 | Akram | |
| 6,466,774 B1 | 10/2002 | Okabe | |
| 6,492,883 B2 | 12/2002 | Liang | |
| 6,514,895 B1 | 2/2003 | Chiu | |
| 6,525,630 B1 | 2/2003 | Zhu | |
| 6,531,936 B1 | 3/2003 | Chiu | |
| 6,535,076 B2 | 3/2003 | Patridge | |
| 6,535,722 B1 | 3/2003 | Rosen | |
| 6,538,603 B1 | 3/2003 | Chen et al. | |
| 6,556,102 B1 | 4/2003 | Sengupta | |
| 6,556,814 B1 | 4/2003 | Klomsdorf | |
| 6,570,462 B2 | 5/2003 | Edmonson | |
| 6,590,468 B2 | 7/2003 | du Toit et al. | |
| 6,590,541 B1 | 7/2003 | Schultze | |
| 6,597,265 B2 | 7/2003 | Liang | |
| 6,608,603 B2 | 8/2003 | Alexopoulos | |
| 6,624,786 B2 | 9/2003 | Boyle | |
| 6,657,595 B1 | 12/2003 | Phillips et al. | |
| 6,661,638 B2 | 12/2003 | Jackson | |
| 6,670,256 B2 | 12/2003 | Yang | |
| 6,710,651 B2 | 3/2004 | Forrester | |
| 6,724,611 B1 | 4/2004 | Mosley | |
| 6,724,890 B1 | 4/2004 | Bareis | |
| 6,737,179 B2 | 5/2004 | Sengupta | |
| 6,759,918 B2 | 7/2004 | du Toit et al. | |
| 6,765,540 B2 | 7/2004 | Toncich | |
| 6,768,472 B2 | 7/2004 | Alexopoulos | |
| 6,774,077 B2 | 8/2004 | Sengupta | |
| 6,795,712 B1 | 9/2004 | Vakilian | |
| 6,825,818 B2 | 11/2004 | Toncich | |
| 6,839,028 B2 | 1/2005 | Lee | |
| 6,845,126 B2 | 1/2005 | Dent | |
| 6,859,104 B2 | 2/2005 | Toncich et al. | |
| 6,862,432 B1 | 3/2005 | Kim | |
| 6,864,757 B2 | 3/2005 | du Toit et al. | |
| 6,868,260 B2 | 3/2005 | Jagielski | |
| 6,888,714 B2 | 5/2005 | Shaw | |
| 6,905,989 B2 | 6/2005 | Ellis | |
| 6,907,234 B2 | 6/2005 | Karr | |
| 6,920,315 B1 | 7/2005 | Wilcox | |
| 6,943,078 B1 | 9/2005 | Zheng | |
| 6,946,847 B2 * | 9/2005 | Nishimori et al. | 324/600 |
| 6,949,442 B2 | 9/2005 | Barth | |
| 6,961,368 B2 | 11/2005 | Dent | |
| 6,964,296 B2 | 11/2005 | Memory | |
| 6,965,837 B2 | 11/2005 | Vintola | |
| 6,993,297 B2 | 1/2006 | Smith | |
| 7,009,455 B2 | 3/2006 | Toncich | |
| 7,071,776 B2 | 7/2006 | Forrester | |
| 7,107,033 B2 | 9/2006 | du Toit | |
| 7,113,614 B2 | 9/2006 | Rhoads | |
| 7,151,411 B2 | 12/2006 | Martin | |
| 7,176,634 B2 | 2/2007 | Kitamura | |
| 7,176,845 B2 | 2/2007 | Fabrega-Sanchez | |
| 7,180,467 B2 | 2/2007 | Fabrega-Sanchez | |
| 7,221,327 B2 | 5/2007 | Toncich | |
| 7,312,118 B2 | 12/2007 | Kiyotoshi | |
| 7,332,980 B2 | 2/2008 | Zhu | |
| 7,332,981 B2 | 2/2008 | Matsuno | |
| 7,339,527 B2 | 3/2008 | Sager | |
| 7,426,373 B2 | 9/2008 | Clingman | |
| 7,468,638 B1 | 12/2008 | Tsai | |
| 7,535,312 B2 | 5/2009 | McKinzie | |
| 7,539,527 B2 | 5/2009 | Jang | |
| 7,596,357 B2 | 9/2009 | Nakamata | |
| 7,667,663 B2 | 2/2010 | Hsiao | |
| 7,711,337 B2 | 5/2010 | McKinzie | |
| 7,714,678 B2 | 5/2010 | du Toit et al. | |
| 7,728,693 B2 | 6/2010 | du Toit et al. | |
| 7,795,990 B2 | 9/2010 | du Toit | |
| 7,852,170 B2 | 12/2010 | McKinzie | |
| 7,865,154 B2 | 1/2011 | Mendolia | |
| 7,969,257 B2 | 6/2011 | du Toit | |
| 2002/0167963 A1 | 11/2002 | Joa-Ng | |
| 2002/0187780 A1 | 12/2002 | Souissi | |
| 2002/0191703 A1 | 12/2002 | Ling | |
| 2002/0193088 A1 | 12/2002 | Jung | |
| 2003/0060227 A1 | 3/2003 | Sekine | |
| 2003/0071300 A1 | 4/2003 | Yashima | |

| | | |
|---|---|---|
| 2003/0114124 A1 | 6/2003 | Higuchi |
| 2003/0193997 A1 | 10/2003 | Dent |
| 2003/0199286 A1 | 10/2003 | du Toit |
| 2003/0232607 A1 | 12/2003 | Le Bars |
| 2004/0009754 A1 | 1/2004 | Smith, Jr. |
| 2004/0137950 A1 | 7/2004 | Bolin |
| 2004/0202399 A1 | 10/2004 | Kochergin |
| 2004/0257293 A1 | 12/2004 | Friedrich |
| 2005/0032488 A1 | 2/2005 | Pehlke |
| 2005/0042994 A1 | 2/2005 | Otaka |
| 2005/0059362 A1 | 3/2005 | Kalajo |
| 2005/0082636 A1 | 4/2005 | Yashima |
| 2005/0093624 A1 | 5/2005 | Forrester |
| 2005/0130608 A1 | 6/2005 | Forse |
| 2005/0215204 A1 | 9/2005 | Wallace |
| 2005/0282503 A1 | 12/2005 | Onno |
| 2006/0003537 A1 | 1/2006 | Sinha |
| 2006/0009165 A1 | 1/2006 | Alles |
| 2006/0160501 A1 | 7/2006 | Mendolia |
| 2006/0183433 A1 | 8/2006 | Mori |
| 2006/0183442 A1 | 8/2006 | Chang |
| 2006/0281423 A1 | 12/2006 | Caimi |
| 2007/0013483 A1 | 1/2007 | Stewart |
| 2007/0042725 A1 | 2/2007 | Poilasne |
| 2007/0042734 A1 | 2/2007 | Ryu |
| 2007/0063788 A1 | 3/2007 | Zhu |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0142014 A1 | 6/2007 | Wilcox |
| 2007/0149146 A1 | 6/2007 | Hwang |
| 2007/0184825 A1 | 8/2007 | Lim et al. |
| 2007/0194859 A1 | 8/2007 | Brobston |
| 2007/0197180 A1 | 8/2007 | McKinzie, III |
| 2007/0200766 A1 | 8/2007 | McKinzie |
| 2007/0285326 A1 | 12/2007 | McKinzie |
| 2008/0055016 A1 | 3/2008 | Morris |
| 2008/0122553 A1 | 5/2008 | McKinzie |
| 2008/0122723 A1 | 5/2008 | Rofougaran |
| 2008/0158076 A1 | 7/2008 | Walley |
| 2008/0274706 A1 | 11/2008 | Blin |
| 2009/0109880 A1 | 4/2009 | Kim |
| 2009/0149136 A1 | 6/2009 | Rofougaran |
| 2009/0215446 A1 | 8/2009 | Hapsari et al. |
| 2009/0253385 A1 | 10/2009 | Dent et al. |
| 2010/0085260 A1 | 4/2010 | McKinzie |
| 2010/0156552 A1 | 6/2010 | McKinzie |

FOREIGN PATENT DOCUMENTS

| | | |
|---|---|---|
| EP | 0685936 | 6/1995 |
| EP | 0909024 | 4/1999 |
| EP | 0909024 | 12/1999 |
| EP | 1137192 | 9/2001 |
| EP | 1298810 | 4/2006 |
| JP | 02-077580 | 9/1991 |
| JP | 03276901 | 8/1998 |
| JP | 10209722 | 8/1998 |
| WO | WO-2009/064968 | 5/2009 |
| WO | WO-2011/044592 | 4/2011 |
| WO | WO-2011/133657 | 10/2011 |
| WO | WO-2011028453 | 10/2011 |

OTHER PUBLICATIONS

Patent Cooperation Treaty, , "International Search Report and Written Opinion", International Applicaton No. PCT/US2010/046241, Mar. 2, 2011.

Patent Cooperation Treaty, , "International Search Report and Written Opinion", PCT Application No. PCT/US08/005085, Jul. 2, 2008.

Qiao, et al., "Measurement of Antenna Load Impedance for power Amplifiers", The Department of Electrical and Computer Engineering, University of California, San Diego, Sep. 13, 2004.

Tombak, Ali , Tunable Barium Strontium Titanate Thin Film Capacitors for RF and Microwave Applications. IEEE Microwave and Wireles Components Letters, vol. 12, Jan. 2002.

Patent Cooperation Treaty, "International Search Report and Written Opinion", International Application No. PCT/US2010/056413, Jul. 27, 2011.

Du Toit, "Tunable Microwave Devices With Auto Adjusting Matching Circuit", U.S. Appl. No. 13/302,617, filed Nov. 22, 2011.

Du Toit, "Tunable Microwave Devices With Auto-Adjusting Matching Circuit", U.S. Appl. No. 13/302,649, filed Nov. 22, 2011.

Greene, "Method and Apparatus for Tuning a Communication Device", U.S. Appl. No. 13/108,463, filed May 16, 2011.

Greene, "Method and Apparatus for Tuning a Communication Device", U.S. Appl. No. 13/108,589, filed May 16, 2011.

Hoirup, "Method and Apparatus for Radio Antenna Frequency Tuning", U.S. Appl. No. 13/030,177, filed Feb. 18, 2011.

Manssen, "Method and Apparatus for Managing Interference in a Communication Device", U.S. Appl. No. 61/326,206, filed Apr. 20, 2010.

Manssen, "Method and Apparatus for Tuning Antennas in a Communication Device", U.S. Appl. No. 12/941,972, filed Nov. 8, 2010.

Manssen, "Method and Apparatus for Tuning Antennas in a Communication Device", U.S. Appl. No. 13/005,122, filed Jan. 12, 2011.

McKinzie, "Adaptive Impedance Matching Module (AIMM) Control Architectures", U.S. Appl. No. 13/293,544, filed Nov. 10, 2011.

McKinzie, "Adaptive Impedance Matching Module (AIMM) Control Architectures", U.S. Appl. No. 13/293,550, filed Nov. 10, 2011.

McKinzie, "Method and Apparatus for Adaptive Impedance Matching", U.S. Appl. No. 13/217,748, filed Aug. 25, 2011.

Mendolia, "Method and Apparatus for Tuning a Communication Device", U.S. Appl. No. 13/035,417, filed Feb. 25, 2011.

Paratek Microwave, Inc., "Method and Appartus for Tuning Antennas in a Communication Device", Internaional Application No. PCT/US11/59620; Filed Nov. 7, 2011.

* cited by examiner

ADAPTIVE IMPEDANCE MATCHING MODULE

BACKGROUND OF THE INVENTION

The function of an adaptive impedance matching module is to adaptively maximize the RF power transfer from its input port to an arbitrary load impedance ZL that changes as a function of time.

One of the important engineering specifications of an impedance matching control system is the dynamic range of input power over which it will operate. The lowest cost RF voltage detector is a simple diode detector, but it has a limited dynamic range of about 25 dB. Logarithmic amplifiers (that detect the signal envelope) have a much higher dynamic range of 50 dB to 60 dB, but their cost, complexity, chip area, and current drain is also much higher. Thus, a strong need exists for an improved adaptive impedance matching apparatus, system and method.

SUMMARY OF THE INVENTION

An embodiment of the present invention provides an apparatus, comprising an RF input port, an RF output port connected to said RF input port via a multichip adaptive impedance matching module (AIMM), said multichip AIMM comprising one or more voltage or current controlled variable reactive elements; and wherein said multichip AIMM is adapted to maximize RF power transferred from said at least one RF input port to said at least one RF output port by varying the bias voltage or bias current to said voltage or current controlled variable reactive elements to maximize the RF voltage at said at least one RF output port. The multichip AIMM may further comprise a controller including a microprocessor operable to use external signals in the operation of a control algorithm and the plurality of variable capacitors and/or a plurality of inductors may be the variable reactive elements. In an embodiment of the present invention, the controller may further comprise at least one analog-to-digital converter and at least one digital-to-analog converter and the multichip AIMM may be a closed loop feedback system adapted to maximize the RF voltage across said RF output node by adjusting all the bias voltages independently.

Further, in an embodiment of the present invention the multichip AIMM may further comprise an RF voltage detector comprising a resistive voltage divider, and a diode detector, and a voltage driver circuit including a means of supplying a relatively high bias voltage or bias current such as a charge pump and a plurality of analog buffers.

Yet another embodiment of the present invention provides a method of adaptive impedance matching, comprising connecting an RF output port to an RF input port via a multichip adaptive impedance matching module (AIMM), said multichip AIMM comprising one or more voltage or current controlled variable reactive elements and wherein said multichip AIMM is adapted to maximize RF power transferred from said at least one RF input port to said at least one RF output port by varying the voltage or current to said voltage or current controlled variable reactive elements to maximize the RF voltage at said at least one RF output port.

Still another embodiment of the present invention provides a machine-accessible medium that provides instructions, which when accessed, cause a machine to perform operations comprising connecting an RF output port to an RF input port via a multichip adaptive impedance matching module (AIMM), said multichip AIMM comprising one or more voltage or current controlled variable reactive elements and wherein said multichip AIMM is adapted to maximize RF power transferred from said at least one RF input port to said at least one RF output port by varying the voltage or current to said voltage or current controlled variable reactive elements to maximize the RF voltage at said at least one RF output port.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1:
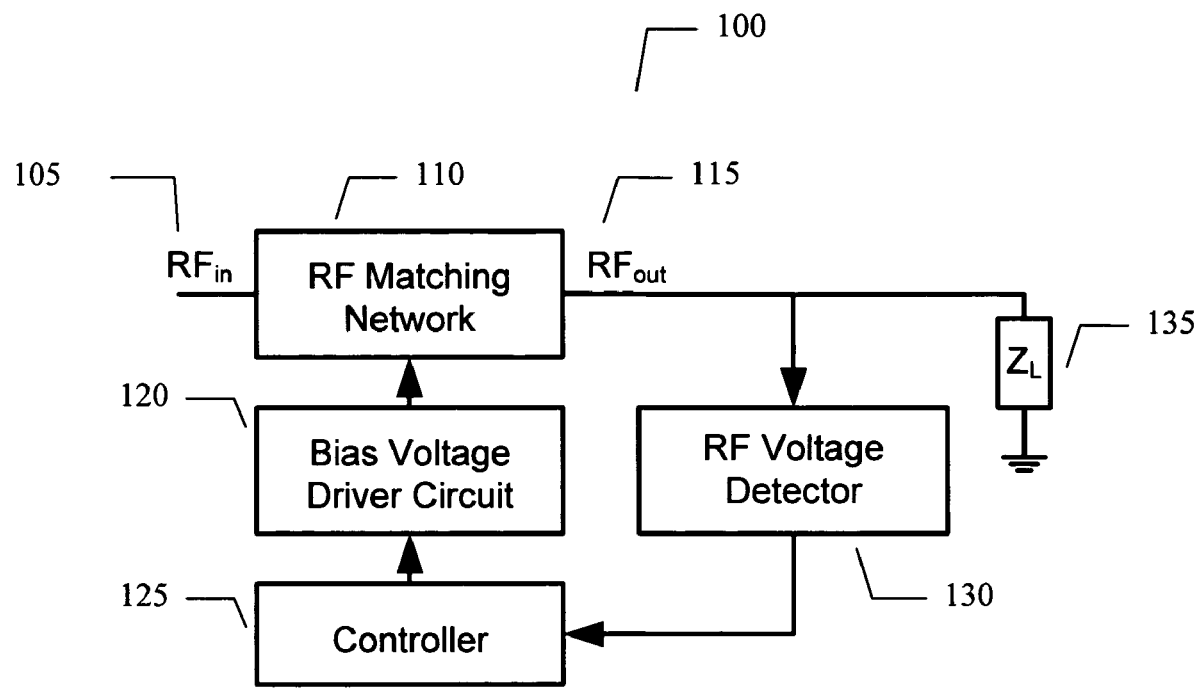
FIG. 1 illustrates a block diagram of an adaptive impedance matching module AIMM control system of one embodiment of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

An embodiment of the present invention provides closed-loop control of an adaptive impedance matching module (AIMM). The RF output node voltage of the AIMM tuner circuit may be monitored and maximized to insure the best available impedance match to arbitrary load impedance. In addition, improvement in dynamic range may be achieved by adaptively changing the RF coupling level between the voltage sensed at the output port (antenna side) of the matching network and the voltage provided to the detector. This coupling level may be controlled by a processor which also does the closed loop tuning. A simple voltage divider comprised of resistors and a digitally controlled RF switch may be used to realize variable coupling levels, although the present invention is not limited in this respect. Another means of realizing variable coupling levels is to digitally switch between different tap points in a series string of variables capacitors which form a shunt voltage tunable dielectric capacitor at the output node of the AIMM tuner.

The function of an adaptive impedance matching module (AIMM) is to adaptively maximize the RF power transfer from its input port to an arbitrary load impedance $Z_L$ where the load changes as a function of time. Turning now to the figures, FIG. 1, shown generally as 100, is an AIMM block diagram.

The RF matching network 110 may contain inductors and capacitors required to transform the arbitrary load impedance $Z_L$ 135 to an impedance equal to or close to a defined system impedance, such as 50 ohms. The net benefit of this transformation is an improvement in the level of power transferred to the load $Z_L$ 135, and a reduction in the level of reflected power from the RF input port 105. This second benefit is also known as an improvement in the input mismatch loss where mismatch loss is defined as $(1-|S_{11}|^2)$.

The RF matching network 110 may contain one or more variable reactive elements which are voltage controlled. The variable reactive elements may be, although are not required to be, variable capacitances, variable inductances, or both. In general, the variable capacitors may be semiconductor varactors, MEMS varactors, MEMS switched capacitors, ferroelectric capacitors, or any other technology that implements a variable capacitance. The variable inductors may be switched inductors using various types of RF switches including MEMS-based switches. The reactive elements may be current controlled rather than voltage controlled without departing from the spirit and scope of the present invention.

In an embodiment of the present invention, the variable capacitors of the RF matching network may be tunable integrated circuits, such as voltage tunable dielectric capacitors or Parascan Tunable Capacitors (PTCs). Each tunable capacitor may be realized as a series network of capacitors which are all tuned using a common tuning voltage.

The RF voltage detector 130 of FIG. 1 may be used to monitor the magnitude of the output nodal voltage. The fundamental concept used in this control system is that the RF power transferred to the arbitrary load impedance 135 is maximized when the RF voltage magnitude at the output port 115 is maximized. It is the understanding of this concept that allows one to remove the directional coupler conventionally located in series with the input port and to thus simplifying the architecture of the control system. A directional coupler is undesirable for numerous reasons:

(1) The cost of the coupler,
(2) The physical size of the directional coupler may be prohibitive: Broadband couplers are typically ¼ of a guide wavelength in total transmission line length at their mid-band frequency. For a 900 MHz band and an effective dielectric constant of 4, the total line length needs to be about 1.64 inches.
(3) The directivity of the directional coupler sets the lower limit on the achievable input return loss of the RF matching network. For instance, a directional coupler with 20 db of coupling will limit the input return loss for the AIMM to about −20 dB.
(4) Directional couplers have limited operational bandwidth, where the directivity meets a certain specification. In some applications, the AIMM may need to work at different frequency bands separated by an octave or more, such as at 900 MHz and 1900 MHz in a commercial mobile phone.

The RF voltage detector 130 may be comprised of a diode detector, a temperature compensated diode detector, a logarithmic amplifier, or any other means to detect an RF voltage magnitude. The phase of the RF voltage is not required. The controller 125 accepts as an input the information associated with the detected RF output 115 voltage. The controller 125 provides one or more outputs that control the bias voltage driver circuits. The controller 125 may be digitally-based such as a microprocessor, a digital signal processor, or an ASIC, or any other digital state machine. The controller may also be an analog-based system.

The bias voltage driver circuit 120 is a means of mapping control signals that are output from the controller 125 to a voltage range that is compatible with the tunable reactive elements in the RF matching network 110. The driver circuit may be an application specific integrated circuit (ASIC) whose function is to accept digital signals from the controller 125 and then output one or more analog voltages for one or more tunable reactive elements in the RF matching circuit 110. The driver circuit 120 may provide a wider range of analog tuning voltages than what is used as a power supply voltage by the controller 125. Hence the driver circuit 120 may perform the functions of voltage translation and voltage scaling.

The purpose of the control system shown in FIG. 1 is to monitor the output RF voltage magnitude and to use this information as an input to an algorithm that adjusts the tuning voltages provided to the tunable reactive elements in the RF matching network 110. The algorithm adjusts the reactances to maximize the RF output 115 voltage. Various options exist for control algorithms. In general, the algorithm may be a scalar multi-dimensional maximization algorithm where the independent variables are the tuning voltages for the reactive elements.

Figure 2:
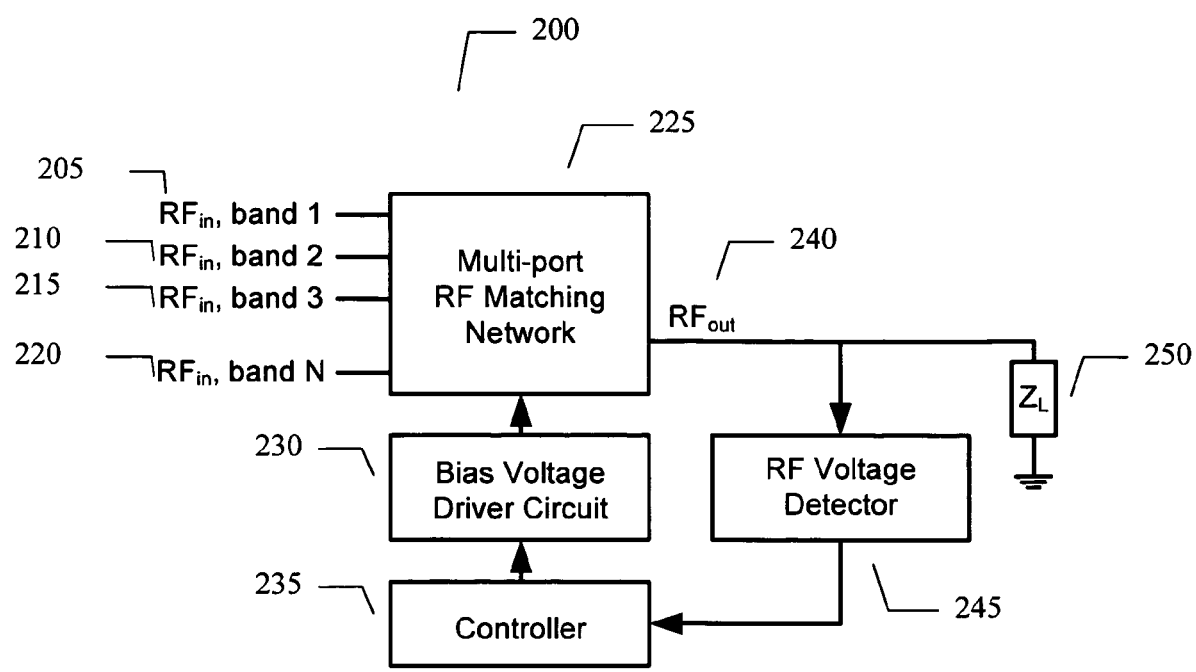
FIG. 2 illustrates a control system for a multi-port adaptive impedance matching module of one embodiment of the present invention.

The simplified control system shown in FIG. 1 is illustrated using a 2 port RF matching network. However, this control system is extensible to multi-port RF matching networks as shown in FIG. 2, generally as 200. Consider a RF multiplexing filter with N input ports where each port is designed for a specific band of frequencies. Assume that N transmitters drive the N input ports 205, 210, 215 and 220, and that each input port is coupled to the single RF output port 240 using RF circuits that contain variable reactive elements. The objective of the control system remains the same, to maximize the RF output voltage magnitude, and thus to optimize the power transfer from the nth input port to the arbitrary load impedance. Further, the RF voltage detector 245, controller 235 and bias voltage driver circuit 230 functions as described above with reference to FIG. 1 and in the embodiment of FIG. 2, the RF matching networks is a multi-port RF matching network 225.

Although the present invention is not limited in this respect, the arbitrary load impedance $Z_L$ 250 may be a multi-band antenna in a mobile wireless device and the multi-port matching network 225 may be a diplexer whose function is to route the signal between two or more paths by virtue of the signal frequency.

Figure 3:
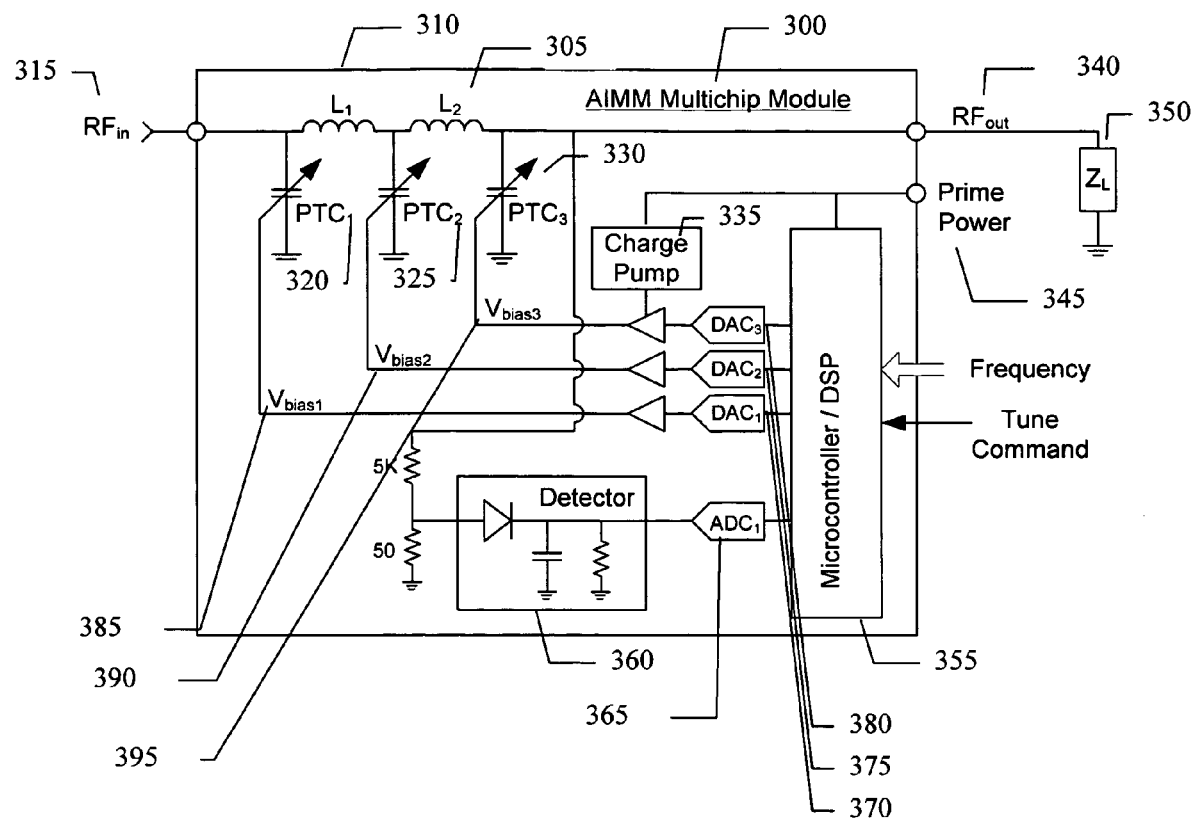
FIG. 3 shows an implementation of an AIMM closed loop control system of one embodiment of the present invention.

Looking now at FIG. 3, the variable capacitors (such as, but not limited to, PTCs) 320, 325 and 330 and inductors 305 and 310 may be built into a multichip module 300 containing a detector 360, an ADC 365, a processor 355, DACs 370, voltage buffers, and charge pump 335. This multichip module 300 may be designed with a closed loop feedback system to maximize the RF voltage across the output node by adjusting all the PTC 320, 325 and 330 bias voltages, and doing so independently.

In an embodiment of the present invention as provided in FIG. 3, the RF matching network may be comprised of inductors $L_1$ 310, $L_2$ 305 and variable capacitors $PTC_1$ 320, $PTC_2$ 325 and $PTC_3$ 330. Note that each variable capacitor may itself be a complex network. The RF voltage detector 360 in this AIMM may be comprised of a resistive voltage divider (5 KΩ/50Ω) and the simple diode detector. In an embodiment of the present invention, the controller may be comprised of the analog-to-digital converter or $ADC_1$ 355, the microprocessor 355, plus the digital-to-analog converters $DAC_1$ 370, $DAC_2$ 375 and $DAC_3$ 380. The controller may use external signals such as knowledge of frequency, Tx or Rx mode, or other available signals in the operation of its control algorithm. The bias voltage driver circuit may be comprised of a DC-to-DC converter such as the charge pump 335, in addition to the three analog buffers whose output voltage is labeled $V_{bias1}$, 385, $V_{bias}$ 390, and $V_{bias3}$ 395. The DC-to-DC voltage converter may be needed to supply a higher bias voltage from the analog buffers than what is normally required to power the processor 355. The charge pump may supply a voltage in the range of 10 volts to 50 volts, and in some embodiments, both positive and negative supply voltages may be used.

It should be noted that the RF matching network shown in FIG. 2 is representative of many possible circuit topologies. Shown in FIG. 2 is a ladder network, but other topologies such as a T or Pi network may be used. The variable reactive elements (capacitors) are shown in shunt connections but that is not a restriction, as they may be used in series in other applications. Furthermore, three independent variable capacitances are shown in this RF matching network. However, fewer or more variable reactive elements may be used depending on the complexity needed to meet RF specifications.

In FIG. 3, the inductors for the RF matching network are shown to be included in the AIMM multichip module. In practice, this may not always be the case. If the module is extremely small, it may be more convenient to use external inductors for the matching network. External inductors may have a higher Q factor than smaller inductors that are able to be integrated on the module.

Figure 4:
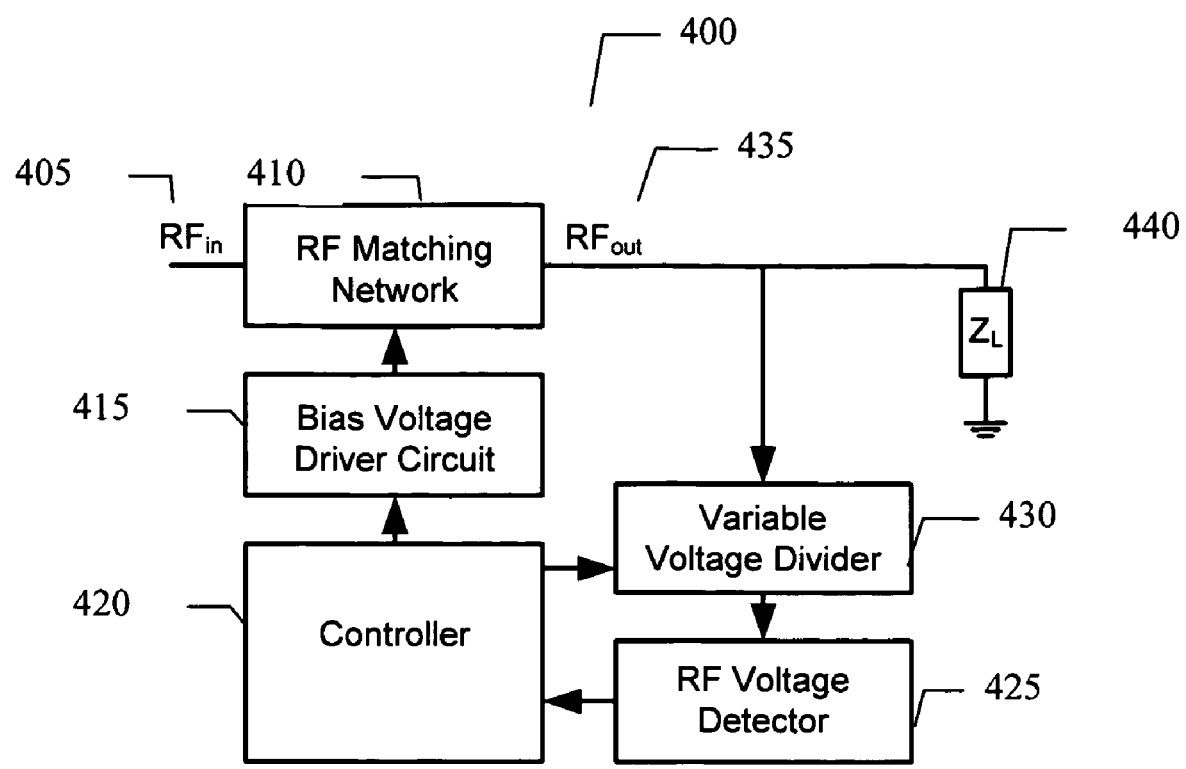
FIG. 4 is a block diagram of an adaptive impedance matching module (AIMM) with a variable voltage divider for improved dynamic range of one embodiment of the present invention.

One of the important engineering specifications of the simplified AIMM control system is the dynamic range of input power over which it will operate. The lowest cost RF voltage detector is a simple diode detector, but it has a limited dynamic range of about 25 dB. Logarithmic amplifiers (that detect the signal envelope) have a much higher dynamic range of 50 dB to 60 dB, but their cost, complexity, chip area, and current drain is also much higher. In an embodiment of the present invention, as illustrated in FIG. 4 at 400, one may use a variable voltage divider to improve the dynamic range of a simple diode detector. The variable voltage divider 430 may be added between the RF output port 435 and the RF voltage detector 425. It is controlled by the loop controller 420 (microprocessor, ASIC, etc), and therefore it is a programmable voltage divider. Bias voltage driver circuit 415 and RF matching network 410 operate as described above with respect to FIG. 1.

Figure 5:
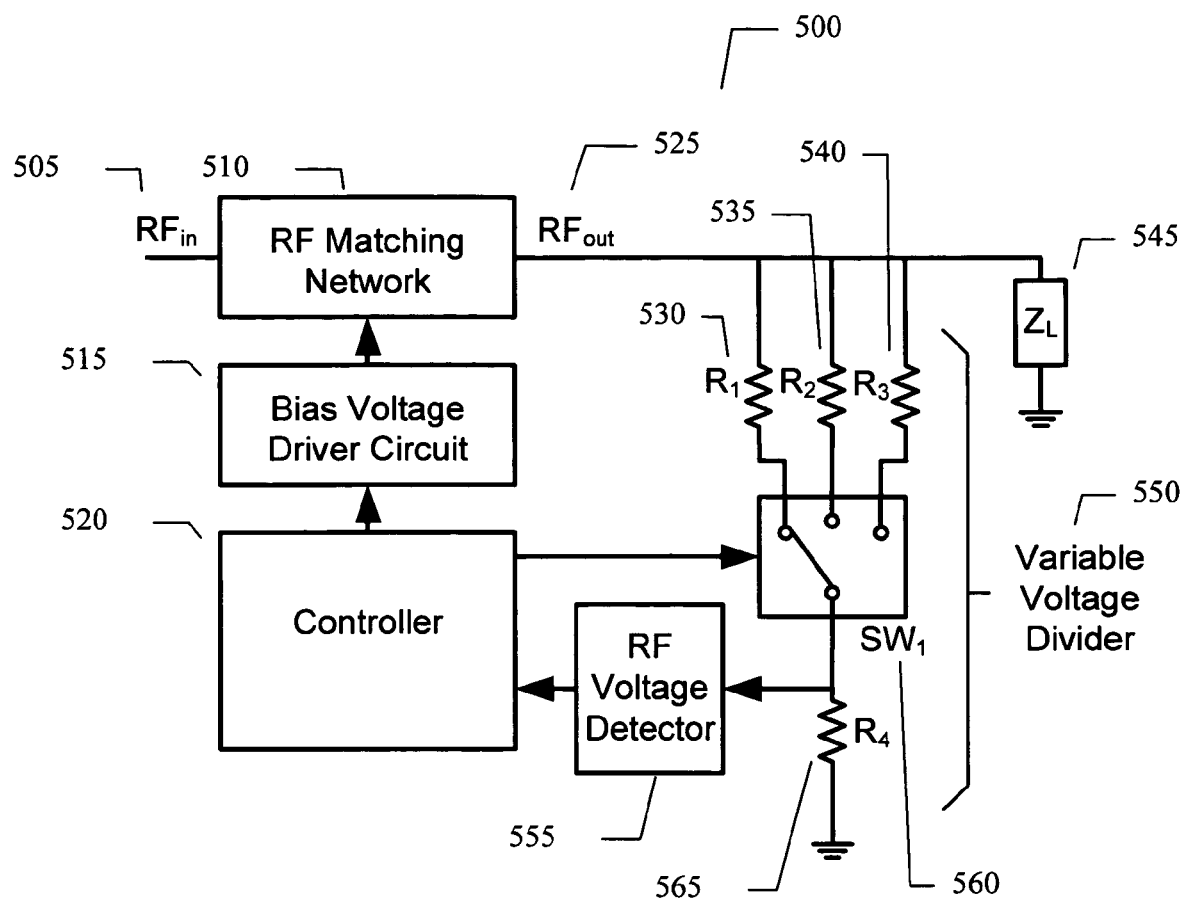
FIG. 5 illustrates an embodiment of an enhanced dynamic range AIMM control system.

As shown in FIG. 5, an embodiment of the present invention provides a simple resistive voltage divider 550 which is implemented using a three-pole RF switch 560 to select one of three different resistances: R1 530, R2 535, or R3 540. Although not limited in this respect, typical values may be 100 Ω, 1 KΩ, and 10 KΩ. A typical value for R4 565 may be 50Ω which would be a desirable value for most RF detector designs. Assuming a high input impedance for the detector 555, the voltage coupling levels would then be ⅓, ½₁, and ½₀₁.

This corresponds to voltage coupling levels of −9.5 dB, −26.4 dB, and −46 dB. At high power levels the lowest coupling is desired. At low power levels, the highest coupling level is desired. The dynamic range of the control loop is equal to that of the detector plus the difference in dB between the highest and lowest coupling levels. As an example, assume a simple diode detector is used which has about 25 dB of dynamic range. The loop dynamic range will then be 25+[−9.5−(−46)]=61.6 dB. The improvement over using no variable voltage divider is more than 36 dB.

Equally important as enhancing the dynamic range is improving the output harmonics and IP3 of the module. The variable voltage divider 550 will allow the detector input port 505 to be more isolated at the higher power levels. This will improve linearity of the module for high signal levels.

Figure 6:
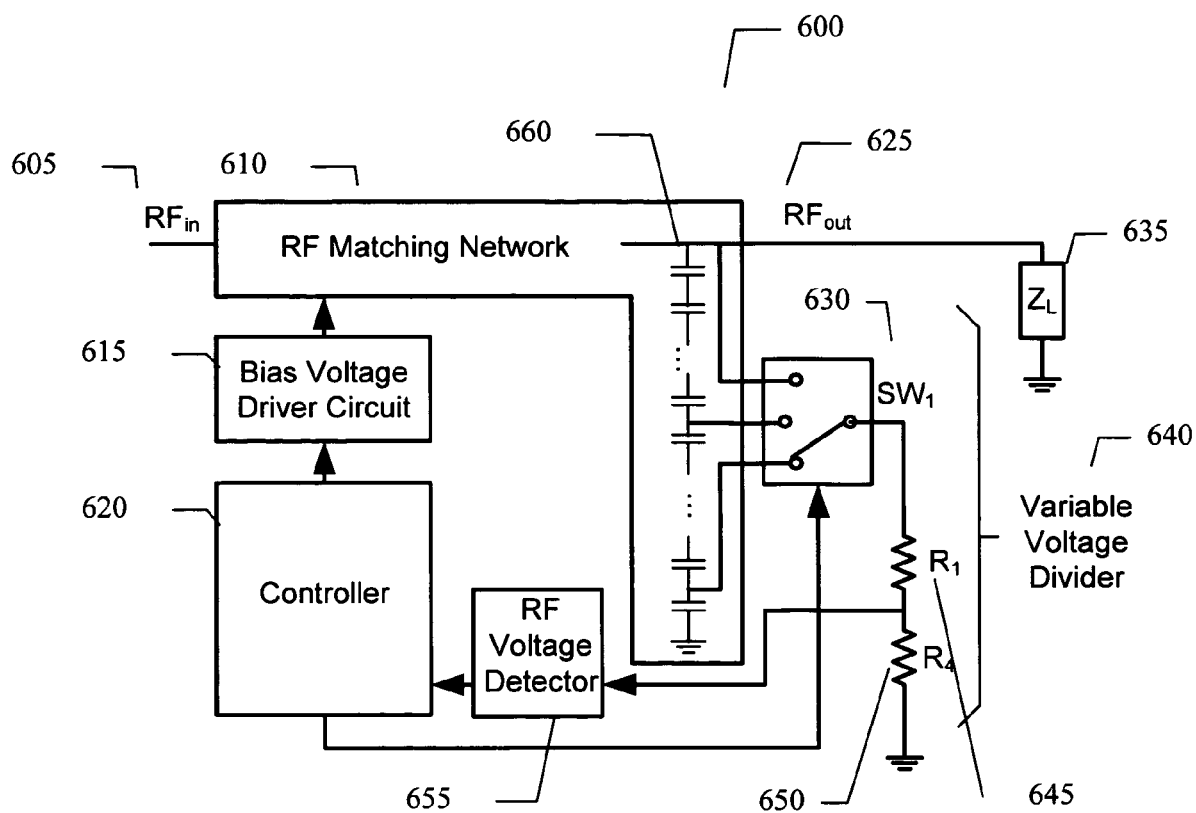
FIG. 6 shows a second embodiment of an enhanced dynamic range AIMM control system.

Turning now to FIG. 6, generally at 600 are the functional blocks of a variable voltage divider 640, and the RF matching network 610 may be combined in hardware to some degree by understanding that the output node 625 of the matching network 610 may be connected to a shunt RF branch comprised of a series string of capacitors 660 and to impedance 635. An input node for RF, 605 may also be connected to the RF matching network 610. This series string 660 may be a RF voltage divider 640, and by selectively tapping into various circuit nodes along the string, one may obtain a variable output voltage divider 640. In an embodiment of the present invention, this is done with a digitally controlled RF switch 630. The switch 630 may be realized with FETs, MEMS, PIN diodes, or any other RF switch technology. Associated with variable voltage divider 640 is RF voltage detector 655 and controller 620, which is further connected to RF matching network 610 via bias voltage driver circuit 615.

As a practical matter, the resistance of R1 645 will need to be much higher (>10×) than the reactance of the string of series capacitors 660 between the tap point and ground. An alternative circuit to FIG. 6 would have the resistor $R_1$ 645 moved to the capacitor side of the switch $SW_1$ 630 and placed in each of the three lines going to the tap points. This will allow the resistors to be built on-chip with the tunable IC used in the matching network. Resister R4 may also be utilized at 650.

Some embodiments of the invention may be implemented, for example, using a machine-readable medium or article which may store an instruction or a set of instructions that, if executed by a machine, for example, by the system of FIG. 1 or FIG. 2, by controller 125 and 235 in communication with bias voltage driver circuit 120 and 230, by processor 355 of FIG. 3, or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

An embodiment of the present invention provides a machine-accessible medium that provides instructions, which when accessed, cause a machine to perform operations comprising adapting an RF matching network to maximize RF power transferred from at least one RF input port to at least one RF output port by controlling the variation of the voltage or current to voltage or current controlled variable reactive elements in said RF matching network to maximize the RF voltage at said at least one RF output port. The machine-accessible medium of the present invention may further comprise said instructions causing said machine to perform operations further comprising receiving information from a voltage detector connected to said at least one RF output port which determines the voltage at said at least one RF output port and providing voltage information to a controller that controls a bias driving circuit which provides voltage or current bias to said RF matching network.

Some embodiments of the present invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors or controllers, or devices as are known in the art. Some embodiments of the invention may include buffers, registers, stacks, storage units and/or memory units, for temporary or long-term storage of data or in order to facilitate the operation of a specific embodiment.

Throughout the aforementioned description, BST may be used as a tunable dielectric material that may be used in a tunable dielectric capacitor of the present invention. However, the assignee of the present invention, Paratek Microwave, Inc. has developed and continues to develop tunable dielectric materials that may be utilized in embodiments of the present invention and thus the present invention is not limited to using BST material. This family of tunable dielectric materials may be referred to as Parascan®.

The term Parascan®t as used herein is a trademarked term indicating a tunable dielectric material developed by the assignee of the present invention. Parascan® tunable dielectric materials have been described in several patents. Barium strontium titanate (BaTiO3-SrTiO3), also referred to as BSTO, is used for its high dielectric constant (200-6,000) and large change in dielectric constant with applied voltage (25-75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material—BSTO—MgO"; U.S. Pat. No. 5,486,491 to Sengupta, et al. entitled "Ceramic Ferroelectric Composite Material—BSTO—ZrO2"; U.S. Pat. No. 5,635,434 by Sengupta, et al. entitled "Ceramic Ferroelectric Composite Material—BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO—ZnO"; U.S. Pat. No. 6,074,971 by Chiu et al. entitled "Ceramic Ferroelectric Composite Materials with Enhanced Electronic Properties BSTO Mg Based Compound—Rare Earth Oxide". These patents are incorporated herein by reference. The materials shown in these patents, especially BSTO—MgO composites, show low dielectric loss and high tunability. Tunability is defined as the fractional change in the dielectric constant with applied voltage.

Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.0 to about 1.0, $Pb_xZr_{1-x}SrTiO_3$ where x ranges from about 0.05 to about 0.4, $KTa_xNb_{1-x}O_3$ where x ranges from about 0.0 to about 1.0, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)5KH_2PO_4$, and mixtures and compositions thereof. Also, these materials can be combined with low loss dielectric materials, such as magnesium oxide (MgO), aluminum oxide ($Al_2O_3$), and zirconium oxide ($ZrO_2$), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconnates, and titanates to further reduce the dielectric loss.

In addition, the following U.S. patents and patent Applications, assigned to the assignee of this application, disclose additional examples of tunable dielectric materials: U.S. Pat. No. 6,514,895, entitled "Electronically Tunable Ceramic Materials Including Tunable Dielectric and Metal Silicate Phases"; U.S. Pat. No. 6,774,077, entitled "Electronically Tunable, Low-Loss Ceramic Materials Including a Tunable Dielectric Phase and Multiple Metal Oxide Phases"; U.S. Pat. No. 6,737,179 filed Jun. 15, 2001, entitled "Electronically Tunable Dielectric Composite Thick Films And Methods Of Making Same; U.S. Pat. No. 6,617,062 entitled "Strain-Relieved Tunable Dielectric Thin Films"; U.S. Pat. No. 6,905,989, filed May 31, 2002, entitled "Tunable Dielectric Compositions Including Low Loss Glass"; U.S. patent application Ser. No. 10/991,924, filed Nov. 18, 2004, entitled "Tunable Low Loss Material Compositions and Methods of Manufacture and Use Therefore" These patents and patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $H_{o2}O_3$, $La_2O_3$, $MgNb_2O_6$, $SrNb_2O_6$, $BaNb_2O_6$, $MgTa_2O_6$, $BaTa_2O_6$ and $Ta_2O_3$.

Films of tunable dielectric composites may comprise Ba1-xSrxTiO3, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include $Mg_2SiO_4$, $CaSiO_3$, $BaSiO_3$ and $SrSiO_3$. In addition to Group 2A metals, the present metal silicates may include metals from Group 1A, i.e., Li, Na, K, Rb, Cs and Fr, preferably Li, Na and K. For example, such metal silicates may include sodium silicates such as $Na_2SiO_3$ and $NaSiO_3$-$5H_2O$, and lithium-containing silicates such as $LiAlSiO_4$, $Li2SiO_3$ and $Li_4SiO_4$. Metals from Groups 3A, 4A and some transition metals of the Periodic Table may also be suitable constituents of the metal silicate phase. Additional metal silicates may include $Al_2Si_2O_7$, $ZrSiO_4$, $KalSi_3O_8$, $NaAlSi_3O_8$, $CaAl_2Si_2O_8$, $CaMgSi_2O_6$, $BaTiSi_3O_9$ and $Zn_2SiO_4$. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include $Mg_2SiO_4$, MgO, $CaTiO_3$, $MgZrSrTiO_6$, $MgTiO_3$, $MgA_{12}O_4$, WO3, $SnTiO_4$, $ZrTiO_4$, $CaSiO_3$, $CaSnO_3$, $CaWO_4$, $CaZrO_3$, $MgTa_2O_6$, $MgZrO_3$, $MnO_2$, PbO, $Bi_2O_3$ and $La_2O_3$. Particularly preferred additional metal oxides include $Mg_2SiO_4$, MgO, $CaTiO_3$, $MgZrSrTiO_6$, $MgTiO_3$, $MgAl_2O_4$, $MgTa_2O_6$ and $MgZrO_3$.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

The additional metal oxide phases can include at least two Mg-containing compounds. In addition to the multiple Mg-containing compounds, the material may optionally include Mg-free compounds, for example, oxides of metals selected from Si, Ca, Zr, Ti, Al and/or rare earths.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. An apparatus, comprising:
a multi-band RF matching network coupled to a plurality of RF input ports and at least one RF output port in a communication device, the matching network comprising one or more controllable variable reactive elements, the communication device being configured for providing voice communications with another communication device; and
a voltage detector coupled to the RF output port via a voltage divider to determine a voltage at the RF output port and provide voltage information to a controller,
wherein the RF matching network is adapted to adjust RF power transferred from the RF input port to the RF output port by varying signals supplied to the controllable variable reactive elements to adjust the RF power at the RF output port,
wherein the controller generates one or more control signals responsive to the voltage information provided by the voltage detector, and
wherein the one or more controllable variable reactive elements are coupled to a bias driver circuit adapted to map the control signals that are output from the controller to a signal range that is compatible with the one or more controllable variable reactive elements in the RF matching network,
wherein the one or more controllable variable reactive elements comprise at least one of:
one or more reactive elements controlled by one or more semiconductor devices, wherein the one or more semiconductor devices are controlled by the one or more mapped control signals generated by the bias driver circuit;
one or more reactive elements controlled by one or more micro-electro-mechanical systems (MEMS) devices, wherein the one or more MEMS devices are controlled by the one or more mapped control signals; or
one or more reactive elements each having a controllable reactance, wherein the reactance of each of the one or more reactive elements is controlled by one of the one or more mapped control signals.

2. The apparatus of claim 1, wherein the voltage divider comprises a network of resistors.

3. The apparatus of claim 1, wherein the voltage divider comprises a network of capacitors.

4. The apparatus of claim 1, wherein the voltage divider comprises a variable voltage divider.

5. The apparatus of claim 4, wherein the variable voltage divider comprises a switchable network of resistors.

6. The apparatus of claim 4, wherein the variable voltage divider comprises a switchable network of capacitors.

7. The apparatus of claim 4, wherein the variable voltage divider is controlled by the controller.

8. The apparatus of claim 4, wherein the variable voltage divider is controlled with one or more switches.

9. The apparatus of claim 8, wherein the one or more switches comprise at least one of semiconductor switches or mechanical switches.

10. The apparatus of claim 1, wherein the voltage detector comprises one of a diode detector or a logarithmic amplifier detector.

11. The apparatus of claim 1, wherein the controller generates the control signals responsive to an operational state of the communication device.

12. The apparatus of claim 2, wherein the mapped control signals generated by the bias driver circuit enable or disable one or more switches that control one or more reactances within the RF matching network.

13. The apparatus of claim 1, wherein the RF matching network is adapted to reduce signal reflections from the variable load impedance.

14. The apparatus of claim 1, wherein the bias driver circuit is adapted to generate at least one of analog or digital signals.

15. An apparatus, comprising:
one or more controllable variable reactive elements coupled to one or more first ports and at least one second port; and
a detector coupled to the second port to provide information to a controller of a communication device during a voice communication;
wherein the one or more controllable variable reactive elements are adapted to adjust power transferred from the first port to the second port by varying signals applied to the controllable variable reactive elements,
wherein the controller generates one or more control signals responsive to the information provided by the detector, and
wherein the controllable variable reactive elements are coupled to a circuit adapted to map the control signals that are output from the controller to a signal range that is compatible with the controllable variable reactive elements,
wherein at least a portion of the controllable variable reactive elements comprise at least one of:
one or more reactive elements controlled by one or more semiconductor devices, wherein the semiconductor devices are controlled by the mapped control signals generated by the circuit;
one or more reactive elements controlled by one or more micro-electro-mechanical systems (MEMS) devices, wherein the MEMS devices are controlled by the mapped control signals; or
one or more reactive elements each having a controllable reactance, wherein the reactance of each of the reactive elements is controlled by one of the mapped control signals.

16. The apparatus of claim 15, wherein the detector is a voltage detector.

17. A non-transitory machine-readable storage medium, comprising computer instructions to:
receive signal information sampled by a detector at a port of a matching network of a communication device during a voice communication with another communication device; and
vary control signals that change one or more reactances within the matching network based at least in part on the information,
wherein the matching network comprises one or more controllable variable reactive elements, and
wherein the matching network is coupled to a circuit adapted to map the control signals to a signal range that is compatible with the controllable variable reactive elements,
wherein the controllable variable reactive elements comprise at least one of:

one or more reactive elements controlled by one or more semiconductor devices, wherein the semiconductor devices are controlled by the mapped control signals generated by the circuit;

one or more reactive elements controlled by one or more micro-electro-mechanical systems (MEMS) devices, wherein the MEMS devices are controlled by the mapped control signals; or one or more reactive elements each having a controllable reactance, wherein the reactance of each of the reactive elements is controlled by one of the mapped control signals.

18. The non-transitory machine-readable storage medium of claim 17, comprising computer instructions to generate the control signals based at least in part on an operational state of the communication device.

19. The non-transitory machine-readable storage medium of claim 18, wherein the voltage divider comprises a network of resistors.

20. The non-transitory machine-readable storage medium of claim 18, wherein the voltage divider comprises a network of capacitors.

* * * * *